United States Patent [19]

Bartelink

[11] Patent Number: 4,949,148
[45] Date of Patent: Aug. 14, 1990

[54] SELF-ALIGNING INTEGRATED CIRCUIT ASSEMBLY

[76] Inventor: Dirk J. Bartelink, 13170 La Cresta Dr., Los Altos Hills, Calif. 94022

[21] Appl. No.: 295,729

[22] Filed: Jan. 11, 1989

[51] Int. Cl.$^5$ .................. H01L 23/02; H01L 23/16; H01L 23/28
[52] U.S. Cl. .............................. 357/74; 357/75; 357/72
[58] Field of Search .................. 357/74, 72, 75, 68, 357/55, 60

[56] References Cited

U.S. PATENT DOCUMENTS

| 3,683,105 | 8/1972 | Shamash | 357/75 |
| 4,670,770 | 6/1987 | Tai | 357/55 |
| 4,698,663 | 10/1987 | Sugimoto | 357/74 |
| 4,811,081 | 3/1989 | Lyden | 357/74 |

FOREIGN PATENT DOCUMENTS

| 0148083 | 7/1985 | Japan | 357/74 |
| 60-17332 | 8/1986 | Japan | 357/74 |

Primary Examiner—Rolf Hille
Assistant Examiner—Wael Fahmy

[57] ABSTRACT

A multi-chip integrated circuit package includes a high-precision self-aligning assembly including a wafer with alignment apertures, a die with alignment slots and pin blocks for mating with both the apertures and the slots. The apertures, slots and pin blocks can be formed with walls along the <111> crystallographic plane so as to be oblique with respect to the <100> crystallographic planes defining the major wafer and die surfaces. These walls are defined photo-lithographically and formed using a highly anisotropic EDP etch. Electrical interfacing between die and wafer is provided using mating gold bumps and pads. The gold pads are formed on flexible silicon dioxide membranes. The membranes are formed over cavities which can be formed just as the apertures are formed. A second wafer with a silicon dioxide layer is bonded to the wafer with the cavities. Etching away the silicon substrate of the second wafer leaves a silicon dioxide membrane over the cavities. Alternatively, space under silicon dioxide membranes is etched using an EPD etch through L-shaped apertures extending into the silicon substrate. The flexiblity of the membrane provides for good electrical contact despite minor spacing variations between die and wafer. The flip-chip assembly comprising the wafer, die and pin blocks can be held together initially by nickel foil and then mounted in a ceramic housing. A heat sink bolted to the housing provides the pressure required for the gold bumps to securely contact the gold pads and deflect the membranes.

8 Claims, 4 Drawing Sheets

U.S. Patent    Aug. 14, 1990    Sheet 1 of 4    4,949,148
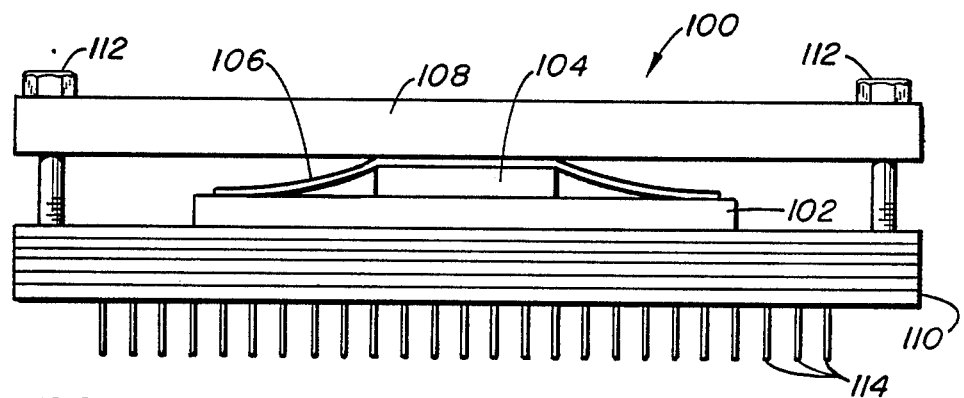
FIG._1.
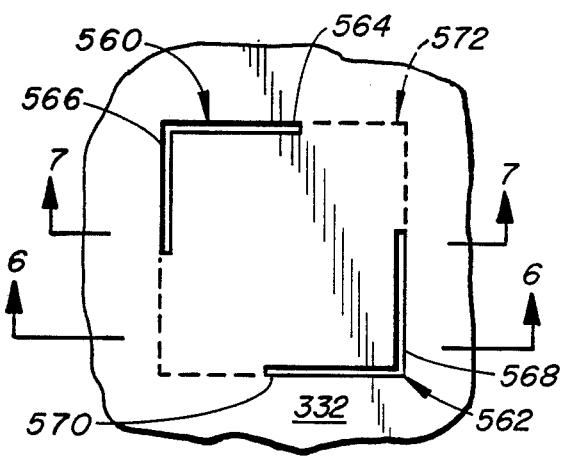
FIG._5.
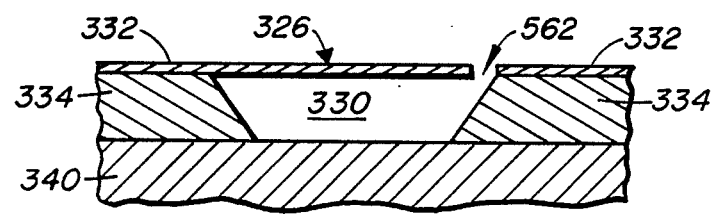
FIG._6.
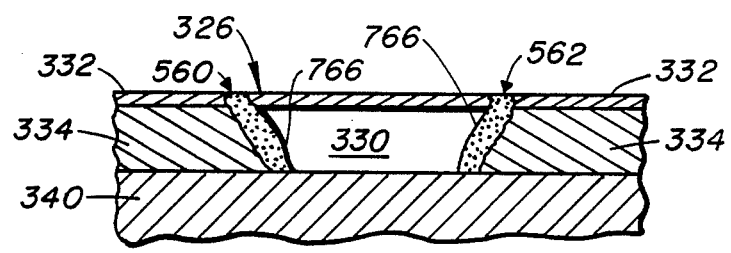
FIG._7.

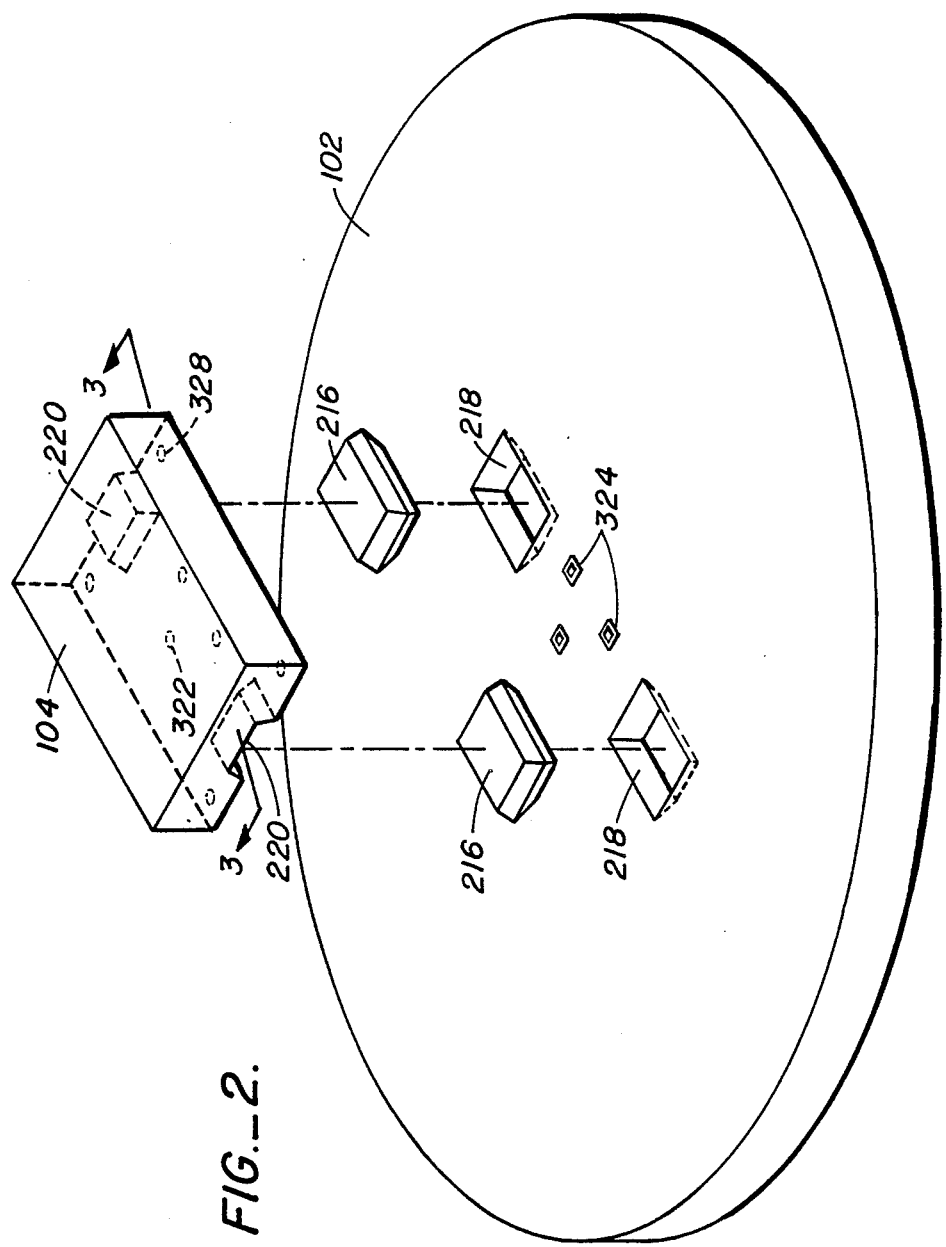
FIG._2.

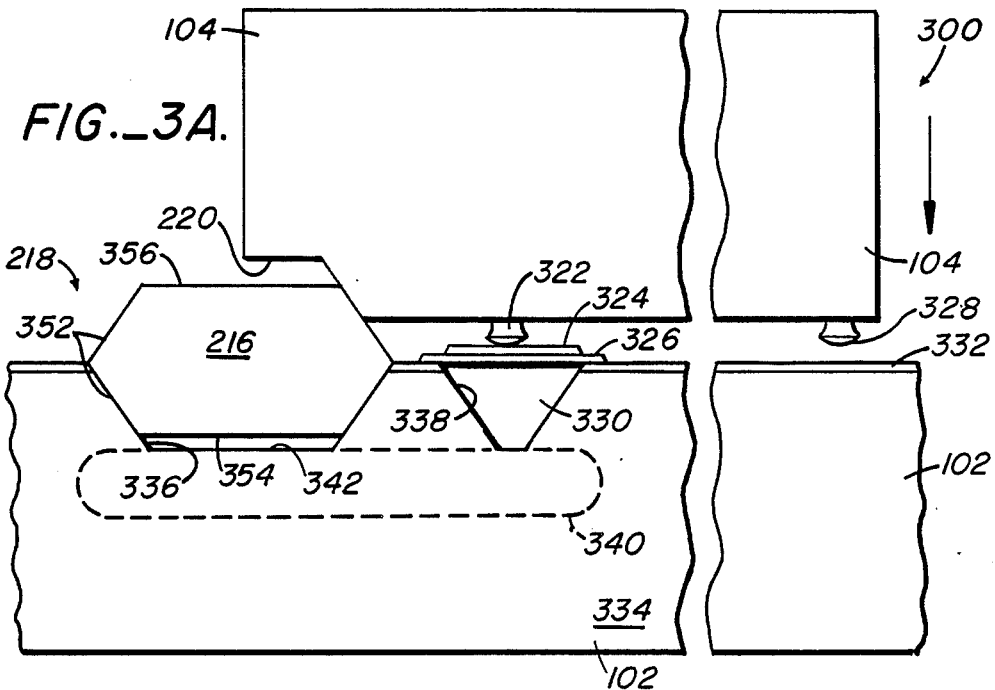
FIG._3A.
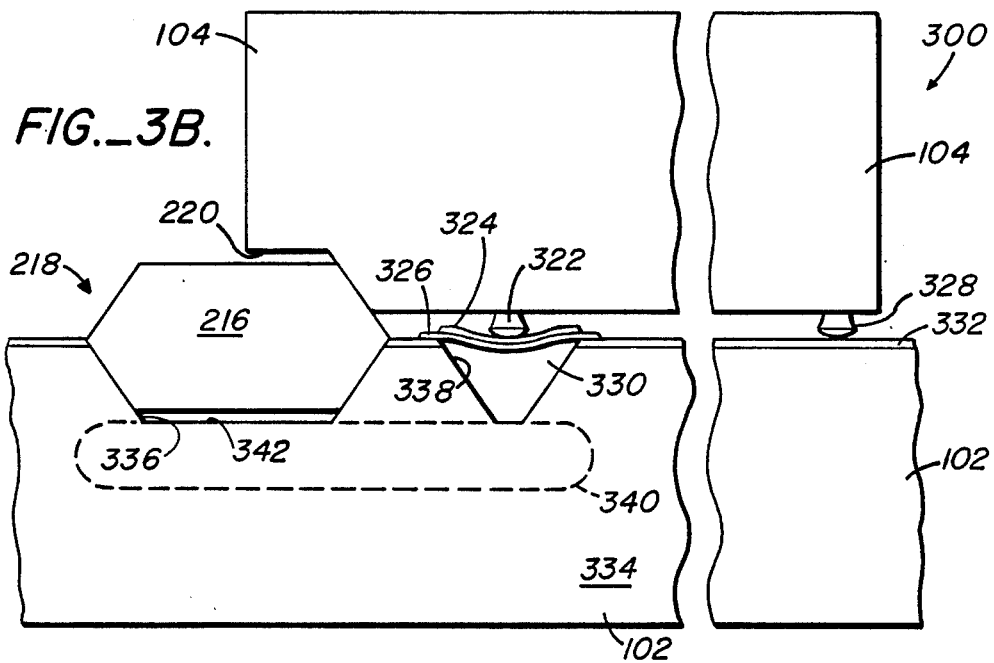
FIG._3B.

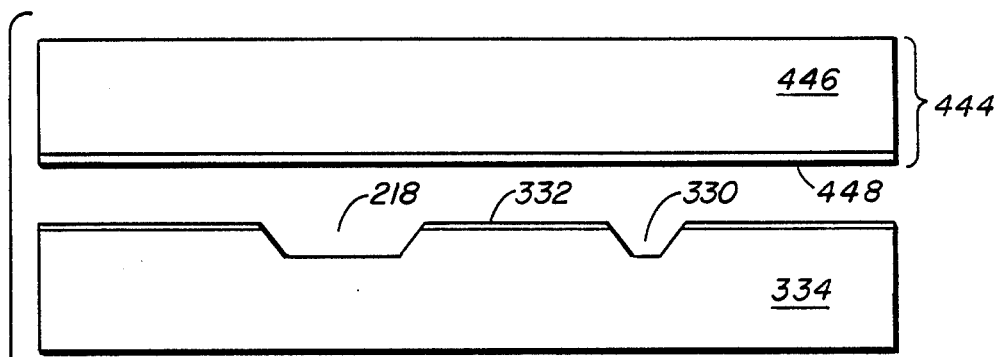
FIG._4A.
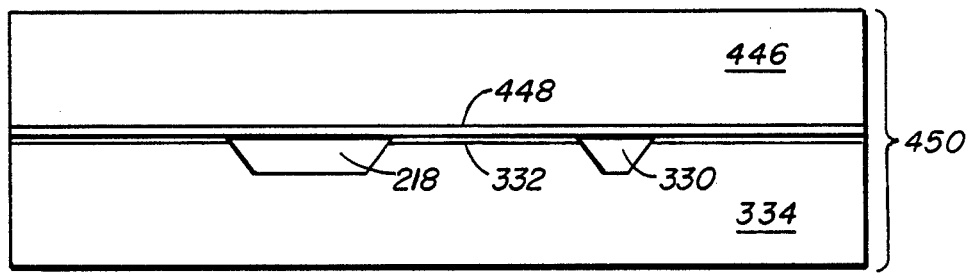
FIG._4B.
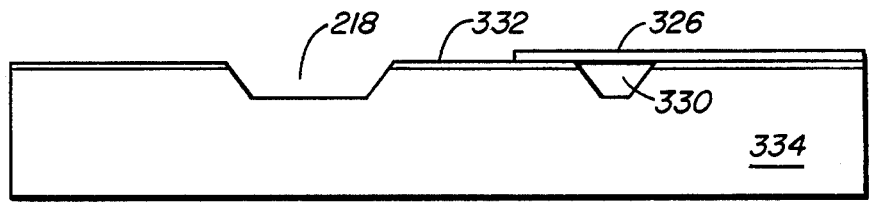
FIG._4C.

SELF-ALIGNING INTEGRATED CIRCUIT ASSEMBLY

BACKGROUND OF THE INVENTION

The present invention relates to integrated circuits and, more particularly, to integrated circuit assemblies with means for precisely aligning opposing integrated circuits.

Much of recent technological progress is derived from advances in integrated circuitry. Computers, scientific instruments and consumer electronics products generally contain large numbers of integrated circuit packages. Typically, an integrated circuit package includes an integrated circuit die and packaging which protects the die and interfaces the die to an incorporating system. The most salient advances in integrated circuit technology have been integrated circuits of increasing circuit density (e.g., very large scale integration (VLSI) circuits), functionality and complexity.

The advantages of increasing circuit density have included lower cost, in part due to the smaller number of parts required to assemble a system, and faster speeds, in part due to the fact that signals travel shorter distances within an integrated circuit than they travel between integrated circuits or discrete components. The cost advantages of VLSI technology can be offset as levels of integration increase. Highly integrated circuits are more subject to yield limitations, which increase the unit cost of working integrated circuits.

More significantly, highly integrated circuits are more difficult to test. Generally, chips are tested by contacting conductive "pads" on the chip using a test probe which is interfaced to a test instrument. The pads must be large enough to allow wire bonding, tape automated bonding, or solder bumps as well as allow reliable contact between the many contacts of the probe and respective pads on the chip during test. With simple integrated circuits, these pads can be distributed about the periphery of the chip. With more complex circuits, the required number of pads requires that they be distributed over the active surface of the chip. The size, distribution and number of pads limit circuit density. In addition, the pads add capacitance to signal paths, limiting the switching speed of the incorporating integrated circuit. Another disadvantage is that redesign of very complex circuits is exponentially more difficult and more frequently required than redesign of simple circuits.

Multi-chip packages have been designed which preserve most of the advantages of very complex single-chip packages while mitigating some significant disadvantages. In a multi-chip package, a complex circuit is distributed among two or more separate chips, each comprising a semiconductor substrate with circuit elements fabricated thereon. The circuitry on each chip can be relatively simple and therefore more easily tested and redesigned. The assembled chips can be included in a single package, maintaining the system manufacturing advantages enjoyed by single-chip packages. Electrical path distances can be made comparable to those in single-chip packages; in some cases, multi-chip packages provide shorter electrical paths.

Another advantage of multi-chip packages is the ease with which different processing technologies can be combined. For example, while bipolar and CMOS technologies have been implemented together on a single chip, the additional processing steps add to cost and reduce yield. A multi-chip package can include separate CMOS and bipolar chips so that there is no yield or process penalty in combining the technologies.

The challenge for multi-chip packages is the interfacing between the chips. Flip-chip interfacing is particularly attractive because it offers potential advantages over even single chip design in functional density. "Flip-chip" interfacing involves mating chips in opposing orientations so that their active surfaces are adjacent. Flip-chip interfacing minimizes electrical path lengths between chips and potentially doubles the circuit density available per unit area.

Demountable-chip multi-chip interfacing is also attractive because of the opportunities it affords for substitution testing. Normally, testing requires very expensive instruments with specially designed probes. However, in some cases a chip in a multi-chip package can be tested simply by installing it in a configuration of chips already known to work.

The key to successful implementation of the demountable-chip multi-chip approach is the conveniently repeatable precision alignment of chips. If the components cannot be aligned precisely, then large contact pads will be required. Large contact pads limit the circuit density of the chips and introduce capacitances which limit device speeds. If chip placement cannot be performed conveniently, repeatedly and precisely, substitution testing and component replacement will be much more difficult.

Typically, flip-chip assemblies utilize large contacts electrically connected using solder balls. These solder balls can be about 150 micrometers tall. Smaller amounts of solder could be used. However, these might fail to interface pads, which are subject to planar misalignment. Moreover, electrical contact can fail due to differential spacing between contacts due to lack of parallelism in the opposing surfaces of flip-chip interfaced chips. Furthermore, stress due to differential thermal expansion between opposing chips can cause the solder ball and its bonds with the chips to deteriorate; this deterioration can lead to electrical failure. What has not heretofore been provided is a system for the convenient, repeatable precision alignment and demountable contact of chips in a multi-chip arrangement. Preferably, the system should provide for reliable performance despite differential thermal expansion.

SUMMARY OF THE INVENTION

In accordance with the present invention, at least one of two integrated circuits in an assembly includes flexible members which can flex to accommodate differences in local spacings defined by mating electrical contacts. This invention takes advantage of the fact that integrated circuit substrates are substantially optically flat so that spacing variations introduced by contacts can be kept within tight tolerances. These tolerances can then be accommodated by flexure beneath mating pairs of contacts.

The two integrated circuits include respective sets of electrical contacts, e.g., conductive pads or bumps. Each contact has some thickness; the thicknesses of a mating pair of contacts combine to space the respective incorporating mating surfaces of the integrated circuits. Ideally, all mating pairs of contacts would define a uniform spacing and thus define electrical paths when the integrated circuits are mated. In practice, the spacings are not identical so that some pairs of contacts touch before others, and the latter can fail to establish a required electrical path. By providing for flexure under the contacts, the nonuniformities in local spacings can be accommodated. Herein, "local spacing" is the distance between the parallel mating surfaces required to allow a respective pair of contacts to be in electrical contact without significant deformation.

A clamp or other means can hold the integrated circuits against each other so that all flexible members are at least slightly flexed. This ensures good physical and electrical contact between mating contacts without requiring soldering. Since the bumps and pads are not bonded, they can slide relative to each other to accommodate differential thermal expansion between the integrated circuits. Limit feet, which can be structurally identical to electrical contacts on one of the integrated circuits, can contact inflexible portions of the opposing integrated circuit to maintain the force on the flexible members within acceptable bounds.

The flexible members can be in the form of cavities covered by a flexible membrane of silicon dioxide. Such a membrane can be made by forming two opposing L-shaped apertures in a silicon dioxide layer and introducing etchant therethrough to define a rectangular void below the silicon dioxide.

An alternative procedure for forming a silicon dioxide membrane begins with defining a cavity in an integrated circuit, for example, with the etch procedure used to form the registration apertures. Such a procedure will leave a silicon dioxide layer over much of the wafer. This silicon dioxide layer can be bonded to a silicon dioxide layer formed on the substrate of a second wafer. Bonding can be effected by pressing the oxidized surfaces together and heating them in an oxidizing atmosphere. Once the silicon dioxide layers are bonded, the substrate of the second wafer is etched away, leaving only the second silicon dioxide layer, which now covers the first wafer, including its cavities. The flatness of the membranes, which is affected by the stresses in the layer, can be controlled by suitable sandwich structures. Thus, the membranes are defined. Unwanted silicon dioxide, for example over the registration apertures, can then be patterned and etched.

Repeatable, precise and convenient alignment of chips is provided using apertures formed in an integrated circuit device, the apertures having walls along a crystallographic plane different from that along which integrated circuit elements are formed. Specifically, for a conventional wafer defined by slicing along a <100> crystallographic plane, the apertures can be formed with walls along <111> crystallographic planes. A highly anisotropic etch, such as potassium hydroxide, conveniently forms photolithographically defined apertures.

The procedure defining apertures for a wafer can be used to form corresponding apertures or notches in a die to be interfaced with the wafer. Appropriate alterations of the procedure allow the formation of pin blocks which can mate with apertures and/or notches in two structures to be interfaced, for example, in a flip-chip arrangement.

The assembly including multiple integrated circuits and pin blocks can be held together using a thermally conducting foil. For example, a nickel foil can be bonded to a wafer and evacuated to hold an integrated circuit die against the pin blocks which register it to the wafer. The clamping action of a heat sink and a ceramic package can apply the pressure required to ensure proper electrical contact between bumps and pads.

The resulting assembly provides greater compactness and faster communication when compared to a set of separate packages with the same level of integration per chip. Without resorting to more complex processing technologies and higher levels of integration, process technologies can be combined (e.g., bipolar and CMOS) and high functionality can be achieved in a single package. Economy and reliability are assured by the availability of substitution testing. In addition, chip "real-estate" can be conserved by omitting the capacitance loadings normally applied to individual circuits for electrostatic discharge (ESD) protection. Provided proper precautions are taken during package assembly (e.g., assembling in a humidity controlled environment), ESD protection can be limited to the mother chip. These and other features and advantages of the present invention are apparent from the description below with reference to the following drawings,

BRIEF DESCRIPTION OF THE DRAWINGS

FIG. 1 is a sectional view of an integrated circuit package including an integrated circuit assembly.

FIG. 2 is an exploded view of part of the assembly shown in FIG. 1.

FIGS. 3A-3B are detailed sectional views of the assembly of FIG. 1 taken along line 3—3 of FIG. 2.

FIGS. 4A-4C illustrate part of a method used to form the flexible membranes for the integrated circuit assembly of FIG. 1.

FIG. 5 shows a plan view of a silicon dioxide coated silicon substrate with L-shaped apertures used in an alternative method for forming flexible members for the integrated circuit assembly of FIG. 1.

FIG. 6 is a sectional view taken along line 6—6 of FIG. 5 and after etchant has been introduced through apertures of FIG. 5.

FIG. 7 is a sectional view taken along line 7—7 of FIG. 5 after polycrystalline silicon has been added to fill apertures of FIG. 5.

DESCRIPTION OF THE PREFERRED EMBODIMENTS

In accordance with the present invention, a multiple integrated circuit package 100 includes a carrier wafer 102, an integrated circuit (IC) die 104, a foil 106, a heat sink 108 and a ceramic housing 110, as shown in FIG. 1. Wafer 102 can be round, as shown, or rectangular. Heat sink 108 is attached to housing 110 with bolts 112 so as to secure the illustrated arrangement of components. In the illustrated embodiment, IC die 104 is a CMOS device which contains most of the active circuitry for package 100, while carrier wafer 102 is bipolar and contains much of the driver circuitry and interconnects for interfacing with conductive paths to pins 114 extending from housing 110. Pins 114 are used for interfacing package 100 to an incorporating system.

Registration of IC die 104 to carrier wafer 102 is provided by pin blocks 216 which fit into matching receptacles in the form of depressions. As shown in FIG. 2, the receptacles in carrier wafer 102 are apertures 218 having a truncated rectangular pyramid form. The receptacles in IC die 104 are in the form of slots 220 at the ends of IC die 104. Pin blocks 216 mate with respective apertures 218 and slots 220 as shown in FIGS. 3A and 3B. Pin blocks 216 thus provide for relative alignment in the X and Y dimensions where the active surfaces of carrier wafer 102 and die define XY planes. Carrier wafer 102, pin blocks 216 and IC die 104 collectively constitute a flip-chip assembly 300 when assembled as shown in FIGS. 3A and 3B.

Apertures 218 and slots 220 are beveled to provide for self-alignment of assembly 100. "Self-alignment" refers to the characteristic that some misalignment during assembly is automatically corrected as components become engaged. For example, pin blocks 216 need not be perfectly aligned with apertures 218 as these elements are mated. Errors within a predetermined capture tolerance are corrected as pin blocks 216 slide into apertures 218. Similarly, IC die 104 need not be perfectly aligned with pin blocks 216 upon engagement. Mating bevels correct initial misalignment during engagement.

Electrical contact between carrier wafer 102 and IC die 104 is made between gold bumps 322 on IC die 104 and gold pads 324 on carrier wafer 102, as best shown in FIG. 3A. Gold pads 324 are formed on flexible membranes 326 which can yield to compensate for small die-to-wafer spacing differences in the vertical or Z dimension as indicated in FIG. 3B. IC die 104 also includes limit feet 328, which are also gold bumps defining a minimum spacing for IC die 104 and carrier wafer 102 and thus limiting the membrane displacement by gold bumps 322. The force for deflecting the membranes is applied by heat sink 108 when it is bolted to housing 110.

Each flexible membrane 326 is of a flexible material such as silicon dioxide and is formed over a cavity 330 filled with compressible or "soft" material. In the illustrated embodiment, cavity 330 is filled with air.

Apertures 218, slots 220 and cavities 330 can be formed using similar processes. In fact, it is preferable to form cavities 330 and apertures 218 of carrier wafer 102 concurrently. An oxide layer 332 can be grown on the crystalline substrate 334 for carrier wafer 102. Oxide is removed from rectangular, preferably square, areas of carrier wafer 102 in which apertures 218 and cavities 330 are to be formed using conventional photo-lithographic procedures. Carrier wafer 102 is then dipped into an etchant system ethylenediamine, pyrocatechol, and water (EDP). The properties of the EDP etch are described by Kurt E. Petersen in "Dynamic Micromechanics on Silicon: Techniques and Devices", *IEEE Transactions on Electron Devices*, Vol. ED-25, No. 10, October 1987, pp. 1241-50. The EDP etches anisotropically along the <111> crystallographic plane so as to define apertures 218 and cavities 330 having respective walls 336 and 338 at about 54 to the wafer's top surface, which is conventionally defined along the <100> crystallographic plane. Apertures 218 have flat bottoms 342 because the etch terminates on a buried p+ layer 340.

The slots 220 are formed in a similar manner in an IC wafer including IC die 104, and many replicas thereof. The dies in the IC wafer are defined conventionally, except that wider "streets" can be allowed between dies to allow for slots 220. Apertures are formed across these streets. Once photo-lithographic processing of the IC wafer is complete, the IC wafer is diced so as to bisect the apertures, rendering slots 220 in IC die 104 and its replicas.

Membranes 326 can be formed as illustrated in FIGS. 4A-4C. FIG. 4A shows a portion of carrier wafer 102 after aperture 218 and cavity 330 have been formed. The thin silicon dioxide layer 332 used to mask the EDP etch remains in place. Placed over the carrier wafer 102 is a dummy wafer 444 having a silicon substrate 446 and a silicon dioxide layer 448. The carrier and dummy wafers 102 and 444 are bonded by pressing oxidized layers 332 and 448 together and inserting them into an oxidizing atmosphere at greater than 700° C., yielding the structure 450 of FIG. 4B. Silicon substrate 446 is etched away leaving silicon dioxide layer 448 bonded to silicon dioxide layer 332 on carrier wafer 102. A portion of silicon dioxide layer 448 is then etched off apertures 218 and, as appropriate, regions in which circuit elements are to be formed. Portions of silicon dioxide layer 448 can be left over cavities 330 to define membranes 326, as shown in FIG. 4C. In addition, portions of silicon dioxide layer 448 can be left over the regions to be contacted by limit feet 328.

This process is related to that described in "Silicon-On-Insulator (SOI) By Bonding and Etch-Back", by Lasky et al., *International Electron Devices Meeting*, 1985, pp. 684-687. However, in the present invention, all silicon of the dummy wafer is removed, so there is no need to grow an epitaxial layer on the dummy wafer substrate.

An alternative method of forming membranes uses the principles disclosed in the Petersen reference cited above. While the silicon substrate of wafer 102 is coated with silicon dioxide, two L-shaped apertures 560 and 562 are formed through the silicon dioxide and into the silicon, as shown in FIG. 5. Aperture 560 has legs 564 and 566; aperture 562 has legs 568 and 570. Extending the legs of the apertures 560 and 562, as shown by dotted lines 564 in FIG. 5, defines a square region 572.

Each leg 564, 566, 568, 570 has a length greater than that of one half of a side of the square region 572 so that orthogonal projections of respective opposing legs 566 and 568 onto an axis aligned with these legs would overlap each other. In other words, legs 566 and 568 extend past each other. Respective opposing legs 564 and 570 likewise extend past each other. This projective overlapping is necessary to ensure a complete etch beneath square region 572. Each leg 564, 566, 568, 570 is wide enough to let an EDP etch attack the silicon below square region 572. The width of the legs of an aperture is not critical and can be as wide as desired. In fact, the apertures can each be triangular instead of L-shaped, one such triangular aperture being defined, for example, by a triangular opening of which two of the sides are colinear with the legs 564 and 566.

An EDP etch through apertures 560 and 562 results in removal of silicon under square 572 to a depth defined by the p+ layer 340, as indicated in FIG. 6. Once the etch is complete, apertures 560 and 562 can be filled with polycrystalline silicon 766 using a polysilicon deposition and etch back or a selective silicon deposition, resulting in the structure of FIG. 7. At the completion of this process, square region 572 defines one of the membranes 326 covering cavity 330.

After membranes 326 are formed, the circuit elements can be defined in carrier wafer 102 as is known in the art. Preferably, gold pads 324 are defined near the end of the processing procedure. Likewise, limit feet 328 and gold bumps 322 are formed on the IC wafer including IC die 104 near the end of the processing of that wafer.

Following the same principles used to form the apertures 218, cavities 330 and slots 220, pin blocks 216 are formed using a EDP etch on a wafer. A silicon wafer with top and bottom surfaces along <100> crystallographic planes is coated on both sides with silicon dioxide. Matching islands of silicon dioxide are defined photo-lithographically on the two wafer surfaces. Silicon dioxide is removed from between the islands. The patterned wafer is then subjected to a EDP etch, producing a multitude of pin blocks 216. Silicon dioxide then can be etched off pin blocks 216. Resulting pin blocks 216 then have sidewalls 352 along <111> crystallographic planes to conform to walls 338 and 338 of apertures 218 and slots 220.

Completed pin blocks 216 are inserted into apertures 218 of carrier wafer 102 so that one end 354 extends into aperture 218 and the other end 356 protrudes from wafer 102. Self-alignment of each pin block 216 with its respective aperture 218 is ensured by the matched sloping walls 352 and 216 of pin blocks 216 and apertures 218, which are all along <111> crystallographic planes. Slots 220 are then disposed over protruding ends 356 of pin blocks 216. Once again, self-alignment results from matched sloping walls, this time walls 338 and 352, respectively of slots 220 and the protruding ends 356 of pin blocks 216.

The approximate dimensions for the illustrated embodiment are as follows. Wafer 102 is roughly 100 millimeters in diameter and about 1.5 millimeters thick. Membrane 326 is about 2–5 microns thick. Gold bumps 322 and limit feet 328 are about 10 microns in diameter and about 10 microns in height.

Preferably, foil 106, which can be nickel foil, is bonded to carrier wafer 102 around IC die 104, as shown in FIG. 1. Wire-bonding pads near the perimeter of wafer 102 are not covered by foil 106 so as to be accessible during wire-bonding to housing 110. A small aperture is formed in foil 106 or defined at the foil boundary with wafer 102 so that air enclosed by foil 106 can be evacuated. Once the air is evacuated, foil 106 is sealed, by any number of conventional means. The sealed foil 106 then serves to hold flip-chip assembly 300 in place for further packaging steps.

The foil-covered flip-chip assembly 300 is placed in housing 110, shown in FIG. 1. Wafer 102 and housing 110 are interfaced using well-known wire bonding or automated tape bonding methods. Heat sink 108 is placed over IC die 104 and foil 106 and bolted to ceramic housing 110 to complete package 100.

An advantage of the present invention, as exemplified above, is that the XY registration of IC die 104 to wafer 102 is defined photo-lithographically. The alignment accuracy between IC die 104 and wafer 102 is the sum of two mask-alignment-and-etching inaccuracies, accounting for apertures 218 and slots 220 plus two more for pin blocks 216, plus an additional inaccuracy from the variation of the in thickness control and the front-to-back alignment in the pin block lithography. Using estimates of about ±1 micron for each of these, the over placement accuracy is about ±5 microns. This compares very favorably with the 50–150 micron placement accuracy attainable using solder balls as interconnects in a multi-chip package.

A second advantage is the ease of disassembly of flip-chip assembly 300. Flip-chip assembly 300 can be nondestructively disassembled, allowing for substitution testing and ready replacement of inoperative integrated circuits. Such recovery and substitution testing are not practicable when a die is soldered to a wafer.

A third advantage of the present invention is its ability to deal with differential thermal expansion of IC die 104 relative to wafer 102. Since they are not bonded, gold bumps 322 can slide relative to gold pads 324 to relieve thermal stresses. The scraping caused by the sliding under the pressure of heat sink 108 helps maintain electrical contact despite the relative movements. In contrast, solder bumps are stressed by differential thermal expansion, causing electrical connections to deteriorate and eventually fail.

A fourth important advantage of the present invention is that the alignment structures, such as the apertures, slots and cavities, are formed using processes that are readily compatible with well-established processing techniques. The steps involve photo-lithographically defined structures and rely on basic materials such as silicon, silicon dioxide and gold. Thus, there is very little overhead involved in implementing the described procedures and structures.

While package 100 embodies a best mode, it is apparent that the present invention provides for many variations. The crystallographic planes selected for the device surfaces and for the alignment structures can be varied. The procedures for forming the alignment structures can be varied to accommodate the selected crystallographic planes. For example, an etchant other than EDP can be used to form walls along crystallographic planes.

In the illustrated embodiment, apertures are formed in the wafer and slots in the die. Other arrangements are employable. For example, apertures can be formed in IC die 104 in place of the slots. Furthermore, protruding structures can be fabricated in a die or wafer to mate with recessive features of the mating device. For example, a wafer can be masked and etched to remove all but small protruding elements which can be used to align with slots in the die. This embodiment dispenses with the need for separate pin blocks. In embodiments using pin blocks, it is not necessary that they conform closely with the walls of the apertures and/or slots. Microspheres, e.g., of alumina or latex, can be used as pin blocks, for example.

There are different options for forming the cavities. They need not be formed concurrently with the apertures nor using a similar process. In fact, the cavities can be formed by etching through the substrate from the bottom or back side. The cavities need not be filled with air. They can be filled with a soft material, such as polyimide. The flexible element need not cover the cavity completely. The element can be a bridge or a cantilever. The formation of cantilevered micro-contacts is well-established. Bridges can be formed by using a pair of cantilevered structures or by patterning a membrane such as that formed in the preferred embodiment described above. Membranes sealed around the perimeter have significant advantages in further processing, particularly in photo-resist spinning.

In the illustrated embodiment, the apertures, slots, cavities and membranes are formed near the beginning of the wafer processing while the gold contacts are formed at the end. One variant is to form a thermally grown silicon dioxide layer early in the process and then pattern the etch windows together with other features on that level. The windows may then be left unetched and covered, or be etched, filled and covered. Later in the process when the other steps are completed, they may be exposed and finished. Alternatively, apertures can be formed during an intermediate or late step in the wafer processing.

In the illustrated embodiment, one die was positioned on a single wafer. Obvious variations include the placing of several dies on a single wafer. The dies do not have to represent the same technology. In fact, the ability to mix process technologies in an integrated circuit package is enhanced by the present invention. In addition, the present invention can be applied to mating two dies together. These and other variations upon and modification to the foregoing embodiments are provided by the present invention, the scope of which is limited only by the following claims.

I claim:

1. An integrated circuit assembly comprising:
   a first integrated circuit, said first integrated circuit having a first crystalline substrate and a first mating surface, said first mating surface including multiple flexible members, said first integrated circuit including a first set of electrical contacts formed over respective ones of said flexible members;
   a second integrated circuit, said second integrated circuit having a second crystalline substrate and a second mating surface, said second mating surface opposing and being substantially parallel to said first integrated circuit, said second mating surface having a second set of electrical contacts formed thereon, said electrical contacts of said second set being in physical contact with respective electrical contact of said first set so as to define respective local spacings between said mating surfaces, each of said local spacings corresponding to a respective electrical contact of said first set;
   lateral self-alignment means for forcing said first and second integrated circuits into alignment upon engagement and constraining relative movement along said mating surfaces of said first and second integrated circuits once engaged; and
   assembly means for effecting engagement and constraining relative movement of said first integrated circuit and said second integrated circuit to prevent physical separation of electrical contacts of said second set from said respective electrical contacts of said first set, said assembly means applying sufficient pressure so as to flex each of said flexible members so as accommodate differences between said local spacings.

2. The integrated circuit assembly of claim 1 wherein said alignment means includes plural pin elements, each of said pin elements having a first end and a second end, said first mating surface being defined along a first primary crystallographic plane of said first integrated circuit and said second mating surface being defined along a second primary crystallographic plane of said second integrated circuit, said first integrated circuit including a first set of plural depressions for receiving first ends of respective ones of said pin elements, each of said depressions of said first set having at least one wall defined along a crystallographic plane other than said first primary crystallographic plane, said second integrated circuit assembly including a second set of plural depressions for receiving second ends of respective ones of said pin elements, each of said depressions of said second set having at least one wall defined along a crystallographic plane other than said second primary crystallographic plane.

3. The integrated circuit assembly of claim 2 wherein said pin elements have walls formed along the same crystallographic planes along which said walls of said depressions of said first and second sets are formed.

4. The integrated circuit assembly of claim 2 wherein said first and second primary crystallographic planes are <100> and said crystallographic planes defining walls of said depression of said first and second sets of depressions are <111>.

5. An integrated circuit structure comprising:
   a wafer having a first crystalline substrate, a wafer surface and circuit elements formed at said wafer surface along a <100> crystallographic wafer plane, said wafer having plural apertures formed therein, said apertures having walls formed along a <111> crystallographic wafer plane, said wafer having cavities extending from said contact surface, said wafer including flexible membranes formed generally parallel to said <100> crystallographic wafer plane and at least partially over said cavities, said wafer having conductive contacts formed on said membranes;
   a die having a second crystalline substrate, a die surface and circuit elements formed at said die surface, said die surface lying along a <100> crystallographic die plane, said die having slots formed therein, said slots having walls along a <111> crystallographic die plane;
   pin elements for engaging said apertures and slots so as to register said die with said wafer; and
   holding means for holding said die and wafer in engagement with said pin elements.

6. The integrated circuit structure of claim 5 wherein said holding means comprises a metal foil bonded to said wafer so as to enclose said die.

7. The integrated circuit structure of claim 5 wherein said holding means comprises a housing and a heat sink, said heat sink being attached to said ceramic housing to cooperate in clamping said die to said wafer.

8. The integrated circuit assembly of claim 1 wherein said electrical contacts of said second set are slidable relative to said electrical contacts of said first set.

* * * * *